United States Patent
Lott

(10) Patent No.: US 8,049,513 B2
(45) Date of Patent: Nov. 1, 2011

(54) METHOD FOR THE ADJUSTMENT OF A DEVICE UNDER TEST

(75) Inventor: Achim Lott, Endingen (DE)

(73) Assignee: Micronas GmbH, Freiburg I.BR. (DE)

( * ) Notice: Subject to any disclaimer, the term of this patent is extended or adjusted under 35 U.S.C. 154(b) by 287 days.

(21) Appl. No.: 12/436,426

(22) Filed: May 6, 2009

(65) Prior Publication Data

US 2009/0278550 A1    Nov. 12, 2009

(30) Foreign Application Priority Data

May 6, 2008   (DE) .................. 10 2008 022 365

(51) Int. Cl.
*G01R 31/02*        (2006.01)
(52) U.S. Cl. ............... 324/537; 324/750.01; 324/750.3
(58) Field of Classification Search .................. None
See application file for complete search history.

(56) References Cited

U.S. PATENT DOCUMENTS

| | | | |
|---|---|---|---|
| 6,154,872 A | 11/2000 | Jones | |
| 6,749,335 B2* | 6/2004 | Gauthier et al. | 374/172 |
| 7,242,198 B2* | 7/2007 | Schneider et al. | 324/686 |

FOREIGN PATENT DOCUMENTS

DE    10154495 A1    5/2003

OTHER PUBLICATIONS

Gert van der Horn et al., "Integrated Smart Sensors Design and Calibration," Micronas, 1997, 3.1.4 and 3.2.

* cited by examiner

*Primary Examiner* — Minh N Tang
(74) *Attorney, Agent, or Firm* — Muncy, Geissler, Olds & Lowe, PLLC

(57) ABSTRACT

A method for adjusting an output signal produced by a device under test from an input variable by: a) positioning the device under test at a first test device with a physical disturbance variable and a known input variable value, b) acquiring at least one measured value for the output signal, c) changing the adjustment state, d) acquiring a further measured value for the output signal, e) positioning the device under test at a further test device having a further disturbance variable value and the input variable value, f) acquiring a further measured value for the output signal, g) changing the adjustment state, h) acquiring a further measured value for the output signal, i) comparing the measured values acquired at the test devices for each adjustment state and determining a first adjustment state in which the correlation between the measured values is larger than in a second adjustment state.

12 Claims, 1 Drawing Sheet

METHOD FOR THE ADJUSTMENT OF A DEVICE UNDER TEST

This nonprovisional application claims priority under 35 U.S.C. §119(a) to German Patent Application No. DE 10 2008 022 365.4, which was filed in Germany on May 6, 2008, and which is herein incorporated by reference.

BACKGROUND OF THE INVENTION

1. Field of the Invention

The invention relates to a method for the adjustment of the output signal that is produced by a device under test and that is dependent on a physical input variable, where the device under test has adjustment means that influence the output signal and that can be put into at least two adjustment states.

2. Description of the Background Art

A method of this type, where the device under test is a semiconductor chip that has a Hall sensor element integrated in a semiconductor substrate, is disclosed in DE 101 54 495 A1. For the adjustment of its output signal the device under test has adjustment means that can be put into at least two adjustment states. In a first step, the device under test, which is located in a wafer structure, is positioned at a first test device, at which a physical disturbance variable that affects the output signal of the device under test, namely a mechanical strain in the semiconductor substrate, has a predetermined disturbance variable value, and an input variable that is to be determined, namely a magnetic field, has a known input variable value. The adjustment means thereby have a first adjustment state. Now, the first measured value for the output signal of the device under test is determined. Then, the wafer is diced and the device under test is mounted in a package. The device under test located in the package is positioned at a further test device, where the disturbance variable has a further disturbance variable value and the input variable has the known input variable value. Now, for the first adjustment state, a further measured value is determined for the output signal and compared with the value determined at the first test device. In the event that the test state can be reproduced exactly at the further test device, all changes between the two output signals can be attributed to detrimental effects of the package in the form of mechanical stresses. In the event that the second value deviates from the first value too much, the adjustment state is changed in order to determine a further measured value for the output signal. The previously mentioned steps are repeated if necessary until the further measured value corresponds to the first measured value. The method has the disadvantage that the adjustment state changes can also affect the output signal of the device under test for the first disturbance variable value. Therefore, inaccuracies can arise during adjustment.

U.S. Pat. No. 6,154,872 A discloses a further method, in which devices under test are tested successively at various temperatures at various test devices. At every test device, a number of tests are performed. If a device under test does not pass the tests, it is marked with a color. Devices under test that pass the tests are installed in a package. This method has the disadvantage that a relatively high number of devices under test need to be culled out when only minimal tolerance for the devices under test can be allowed.

Therefore, there is the need to specify a method of the type initially mentioned that enables a quick and exact adjustment as well as a high product quality for the device under test.

SUMMARY OF THE INVENTION

This need is met by the following steps:
a) positioning the device under test at a first test device, in which a physical disturbance variable has a predetermined disturbance variable value and the input variable has a known input variable value,
b) acquiring at least one measured value for the output signal,
c) changing the adjustment state,
d) acquiring at least one further measured value for the output signal,
e) positioning the device under test at a further test device, at which the disturbance variable has a predetermined further disturbance variable value and the input variable has the known input variable value,
f) acquiring at least one further measured value for the output signal,
g) changing the adjustment state,
h) acquiring at least one further measured value for the output signal,
i) for each adjustment state, comparing the measured values acquired at the test devices and acquiring a first adjustment state in which the correlation between the measured values is larger than in a second adjustment state,
j) adjusting the first adjustment state in the event that the adjustment state of the device under test deviates from the first adjustment state.

Advantageously, the device under test is positioned at a minimum of two test devices, at which different and in each case constant disturbance variable values are set. After positioning the device under test at one of the test devices, only the current device under test needs to be adjusted to the respective disturbance variable value, while the environment of the device under test is already at the disturbance variable value. In this way, the device under test can be adjusted quickly and with great precision to the appropriate disturbance variable value in a test environment with primarily static properties.

In an advantageous embodiment of the invention, the adjustment means can be put in more than two adjustment states, whereby the first adjustment state is chosen in such a way that no other adjustment state gives a better correlation between the measured values than the first adjustment state. The output signal of the device under test can then be maintained even more exactly at various disturbance variable values.

It is advantageous if steps c) and d) are repeated at least once after step d) before continuing with step e) and/or if steps g) and h) are repeated at least once after step h) before continuing with step i). The disturbance variable value can therefore be changed a multiple number of times at the test devices in order, through adjustment, to make the output signal of the device under test even less sensitive to a change in the disturbance variable.

Advantageously, at least two different input variable values are connected to the device under test at each test device, whereby steps b) through d) and f) through h), respectively, are each performed at least once for each set input variable value and whereby in step i) the measured values determined for each combination of an adjustment state and an input variable value are compared with each other. The sensitivity of the device under test is therefore measured for different adjustment state and input variable value combinations, and the adjustment state is set in such a way that the sensitivity is influenced as little as possible by a change in the disturbance variable value.

In an advantageous embodiment of the invention, a number of devices under test are positioned successively at the first test device, where for each device under test steps a) through d) are performed, where the measured values acquired at the first test device are cached, where the devices under test are afterwards successively positioned at the second test device, and where steps e) through k) are performed for each device under test. The devices under test are therefore individually successively positioned at the test devices according to the inline principle. Here, only the measurement data of the current devices under test located at a test device or between two test devices need to be cached. Compared with a method where a large number of devices under test are simultaneously positioned at a test device, the amount of measurement data that needs to be cached is hereby considerably reduced. The duration that the device under test requires for the transport from one test device to the other is used to adjust the disturbance variable level of the device under test to the predominant, differing disturbance variable values at the individual test devices.

It is advantageous if the measured values determined for the device under test at the first test device are relayed to the second test device before measured values are determined for a further device under test at the first test device. In this case, the measured values relayed to the second test device are cached in a queue until steps f) through h) have been performed for the given device under test. For the transfer of measured values from the first to the second test device the test devices can be connected to each other via a data bus. The data bus can specifically be a TCP/IP connection where the second test device acts as server and the first test device acts as client.

After the measured values from the first test device have been relayed to the second test device, the measured values cached at the first test device can be deleted and/or overwritten.

Preferably, each of the devices under test is assigned an identifying code, where the code, together with the measured values acquired for the appropriate device under test at the first test device, are relayed to and cached at the further test device in the form of a data set, where after every positioning of a device under test at the further test device the code assigned to the appropriate device under test is relayed to the further test device, and where in step i) the measurement data of this data set are compared with the measured values determined for the device under test at the further test device, where the code stored in the data set corresponds to the code belonging to the device under test positioned at the further test device. In this way, the measured values at the second test device can still be correlated with the correct device under test if a device under test is deleted from the test series and/or if devices under test are interchanged.

It is advantageous if the devices under test each have an electronic circuit that has at least one sensor element and that is integrated in a semiconductor chip and if the circuits are integrated in a wafer and the semiconductor chips are diced from the wafer before the devices under test are positioned at the test devices. Here it is even possible that the semiconductor chip is installed in a package before the device under test is positioned at the test device. In this way, all influencing factors present in the device under test production process chain, including the effect of the package on the output signal of the device under test, are taken into consideration during the calibration.

In an advantageous embodiment of the invention, the disturbance variable is temperature. The devices under test manufactured by this method then have an output signal that is largely independent of the temperature after the adjustment of the measured values.

It is advantageous if the input variable is the magnetic flux density. With the method according to the invention, specific magnetic field sensors, such as Hall sensors and/or magnetoresistive devices under test, can be advantageously tested and adjusted to be insensitive to a disturbance variable relative to their output signal.

Preferably, by changing the adjustment states, the offset of the output signal and/or the gain factor adjust at least one amplifier that supplies the output signal from the device under test. The device under test may have a sensor element and an adjustable control and/or signal processing device that interacts with the sensor. Here it is even possible for the control and/or signal processing device to have a plurality of amplifier and/or signal processing stages, whose offsets and/or gain factors are set separately from one another for the adjustment of the output signal.

BRIEF DESCRIPTION OF THE DRAWINGS

An illustrative embodiment is explained in greater detail below with reference to the drawing. The drawing shows.

DETAILED DESCRIPTION

With a method to adjust the output signals of devices under test 1, a plurality of devices under test are provided that are each sensitive to a measured variable, namely the magnetic flux density. The output signals of the device under test 1 are furthermore influenced by a disturbance variable, namely the temperature of the device under test 1.

Figure 1:
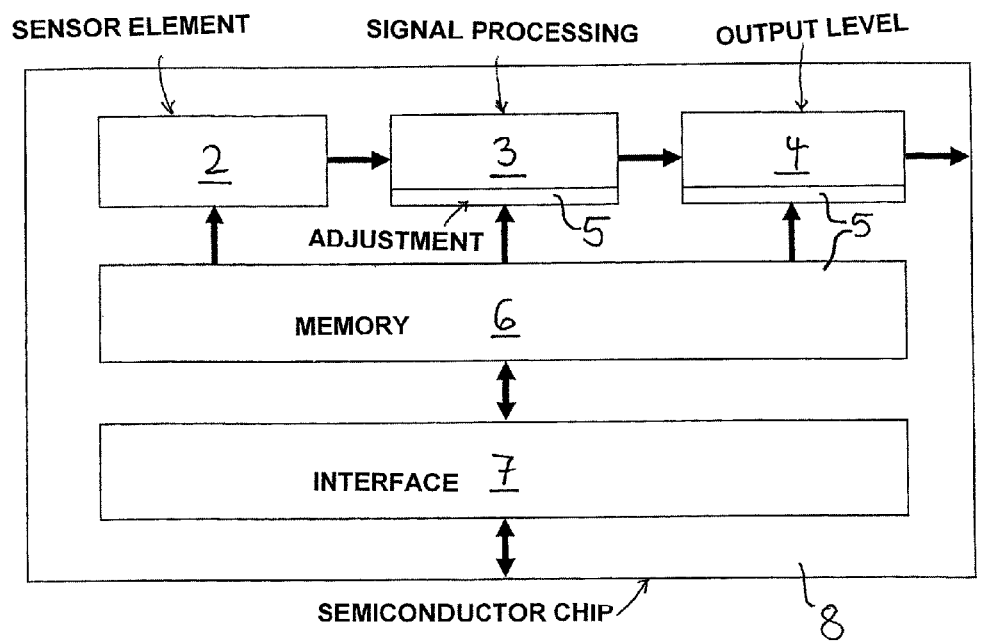
FIG. 1 a block diagram of a Hall sensor and
FIG. 2 an adjustment device for adjusting the output signals of a plurality of Hall sensors.

To provide the devices under test 1, a plurality of electronic circuits are first installed in a wafer in a manner that is known. As seen in FIG. 1, the electronic circuits each comprise at least one sensor element 2 that is sensitive to the input variable and has a control and/or signal processing device that interacts with said sensor element and that has a signal processing level 3 and an output level 4 acting with it. Furthermore, the individual circuits each have an adjustment means 5, which can be placed in a plurality of various adjustment states by means of a programmable, nonvolatile register memory 6. The register memory 6 is connected to electrical contact points via a communication interface 7 in order to change its memory content. Via the register memory 6, the offset and/or the gain factor can be set by various circuit components associated with the control and/or signal processing device, the output level 4 and/or the sensor element 2.

The electronic circuits are now diced by cutting semiconductor chips 8 in which the circuit is integrated from the wafer. The semiconductor chips 8 have electrical contact points that are attached to connecting contacts via bond wires and/or bumps. Furthermore, the semiconductor chips 8 are installed in a package from which the connecting contacts protrude.

Figure 2:
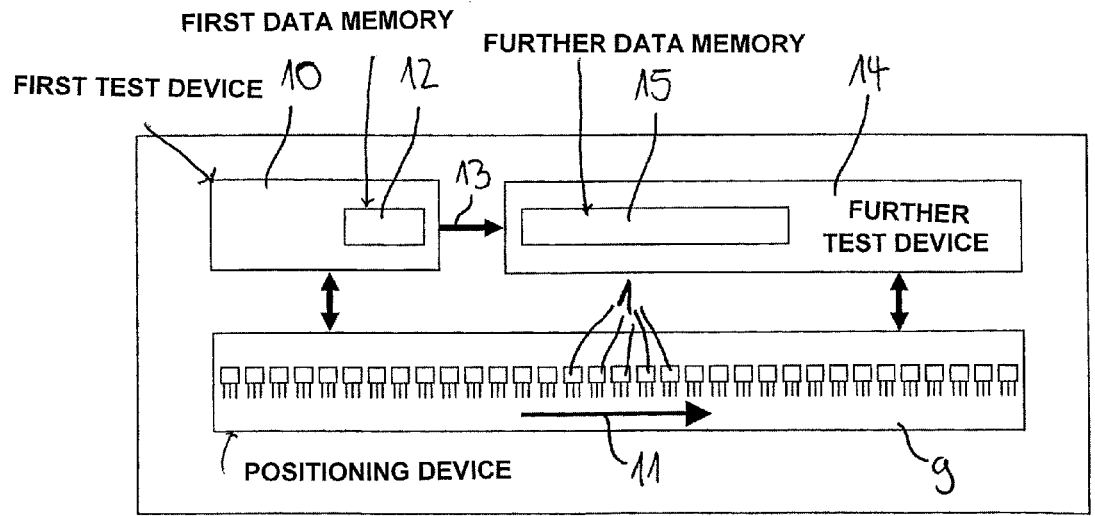

As seen in FIG. 2, the devices under test 1 prepared in this way are now positioned at a test device 10 with the help of a positioning device 9. The first test device 10 is held at a predetermined first temperature value with the help of a first temperature control device, which is not depicted in further detail in the drawing.

The first test device 10 has matching contacts, not depicted in further detail in the drawing, that align with the connecting contacts of the device under test. It is clearly discernable that the devices under test 1 are arranged in a row that moves past the first test device 10 in the direction of the arrow 11.

Thereby one device under test 1 is positioned at the first test device 10 in such a way that the matching contacts of the first test device 10 make electrical contact with the connecting contacts of the respective device under test 1.

For part identification, the positioning device 9 creates a unique identifying code for every device under test and transfers this code to the first test device 10.

Now, with the help of the first test device 10, a measured value for the output signal of the device under test 1 is acquired and cached in the first data memory 12. Then, through reprogramming of the register memory 6 of the device under test 1, the adjustment state is altered in such a way that the offset of the output signal is changed. Then, a further measured value is acquired for the output signal of the device under test 1 and cached in the first data memory 12.

If necessary, the previously mentioned steps may be repeated one or more times in order to acquire output signal measured values for further adjustment states, and in a corresponding manner to store them in the first data memory 12.

The first test device 10 has a first coil, not depicted in further detail in the drawing, that is connected to a first electrical current source in order to create a magnetic field.

After a measured value has been acquired for each adjustment state that affects the output signal's offset and that can be set on the device under test 1, while the first coil is not energized, the first coil is then energized in order to apply a first magnetic flux density as a first input variable value of the device under test 1 positioned at the first test device 10.

Now, with the help of the first test device 10, a measured value for the output signal of the device under test 1 is acquired and cached in the first data memory 12. Then, through reprogramming of the register memory 6 of the device under test 1, the adjustment state is altered in such a way that the amplification or the sensitivity of the output signal is altered. Then, a further measured value is acquired for the output signal of the device under test 1 and cached in the first data memory 12.

If necessary, the previously mentioned steps can be repeated one or more times in order acquire output signal values for further adjustment states and to store them in the first data memory 12.

Now the supply of current to the first coil is changed in order to apply a second input variable value for the device under test 1 that preferably matches the value of the first input variable value but is oriented in the opposite direction. Then, the previously mentioned steps are performed in a corresponding manner for the second input variable value, so that afterwards a number of measured values for the sensitivity are saved in the first data memory 12 and so that this number is twice the number of the adjustment states that can be set for the device under test 1.

If necessary, the previously mentioned steps may be repeated one or more times, in a corresponding manner, in order to acquire a number of output signal measured values that correspond to the number of adjustment states for further input variable values, and to save them in the first data memory 12.

After all measured values for the first temperature value of the device under test 1 currently positioned at the first test device 10 have been determined, a data set consisting of the code and the measured values is relayed over a data transfer path 13 to a further data memory 15 dedicated to a further test device 14 and cached there in a queue. The data transfer path 13 is preferably implemented as a TCP/IP connection.

With the help of the positioning device 9, the devices under test 1 are transported along in the direction of the arrow 11 in order to position a further device under test 1 at the first test device 10 and to determine the code and respective measured values in the manner described above and to transfer them in the form of a data set to the further test device 14.

While each device under test 1 is positioned at the test device 10 with the help of the positioning device 9, further devices under test 1 located farther ahead in the row are simultaneously each positioned at the further test device 14. This device has matching contacts, not depicted in further detail in the drawing, that align with connecting contacts of the devices under test 1, and that connecting contacts of the device under test 1 connect with when the device under test is positioned at the further test device 14. The positioning device 9 transfers the code of the device under test 1 currently positioned at the further test device 14 to the further test device 14. There, the coding is cached in the further data memory 15.

The further test device 14 also has a second coil, not depicted in further detail in the drawing, that is connected to a second electrical current source for the purpose of creating a magnetic field.

Now, with the help of the further test device 14, with the coil in the nonenergized state, a value for the output signal of the device under test 1 is acquired and cached in the further data memory 15. Then, the register memory 6 of the device under test 1 is reprogrammed via the further test device 14 in order to change the offset of the output signal. Then, a further measured value is acquired for the output signal of the device under test 1 and cached in the further data memory 15.

If necessary, the previously mentioned steps can he repeated one or more times in order acquire output signal measured values for further adjustment states and in order to save them in the further data memory 15.

After a measured value has been acquired for each adjustable adjustment state on the device under test 1 at the further test device 14, the second coil is energized in order to apply the first magnetic flux density as the first input variable value to the device under test 1 positioned at the further test device 14.

Now, with the help of the further test device 14, a measured value for the output signal of the device under test 1 is acquired and cached in the further data memory 15. Then, through reprogramming of the register memory 6 of the device under test 1, the adjustment state is altered in such a way that the amplification or the sensitivity of the output signal is altered. Then, a further measured value is acquired for the output signal of the device under test 1 and cached in the further data memory 15.

If necessary, the previously mentioned steps can be repeated one or more times in a similar manner in order to acquire output signal values for further adjustment states and in order to save them in the farther data memory 15.

After all the necessary measured values have been acquired for a device under test 1 at the first test device 10 as well as the further test device 14, with the aid of the code assigned to the device under test positioned at the further test device 14 and with the aid of the codes saved in the data sets of the data memory 15, a data set is assigned to the given device under test.

For every adjustment state, the acquired measured values for the offset adjustment and the sensitivity adjustment are each compared with each other in order to determine the adjustment state at which the correlation between the values is the greatest for both the offset as well as the sensitivity adjustment state. The established adjustment state is programmed into the register memory 6 at the further test device 14.

It should also be mentioned that the term "disturbance variable" is not limited to a temperature disturbance variable. Rather, the method according to the invention can also be used with other disturbance variables that preferably require a longer waiting period after a disturbance variable change until a stable disturbance variable value establishes itself. Thus, the disturbance variable may also, for example, be the concentration of a gas located in the area around the device under test 1, or the moisture content in a gas, and/or an ion concentration in a fluid around the device under test 1.

Also, the invention is not limited to the adjustment of magnetic field sensors. Rather, the invention can be used with any sensors 1, in particular to adjust the brightness control of adaptive displays and/or lighting devices, to adjust pressure sensors or pH-sensitive sensors. Furthermore, the frequency response of a filter can also be adjusted with the help of this method.

The invention claimed is:

1. A method for the adjustment of an output signal that is produced by a device under test and that is dependent on a physical input variable, wherein the device under test has adjustment means that influence the output signal and that is put in at least two adjustment states, comprising the following steps: a) positioning the device under test at a first test device, in which a physical disturbance variable has a predetermined disturbance variable value and the input variable has a known input variable value, b) acquiring at least one measured value for the output signal, c) changing the adjustment state, d) acquiring at least one further measured value for the output signal, e) positioning the device under test at a further test device, at which the disturbance variable has a predetermined further disturbance variable value and the input variable has the input variable value, f) acquiring at least one further measured value for the output signal, g) changing the adjustment state, h) acquiring at least one further measured value for the output signal, i) for each adjustment state, comparing the measured values acquired at the test devices and determining a first adjustment state in which the correlation between the measured values is larger than in a second adjustment state, j) adjusting the first adjustment state in the event that the adjustment state of the device under test deviates from the first adjustment state.

2. The method according to claim 1, wherein the adjustment means is set to at least two adjustment states, and wherein the first adjustment state is chosen in such a way that no other adjustment state gives a better correlation between the measured values than the first adjustment state.

3. The method according to claim 1, wherein steps c) and d) are repeated at least once after step d) before continuing with step e)and/or wherein steps g) and h) are repeated at least once after step h) before continuing with step i).

4. The method according to claim 1, wherein at least two different input variable values are connected to the device under test at each test device, wherein the steps b) through d) and f) through h), respectively, are each performed at least once for each set input variable value, and wherein in step i) all the combinations of acquired values, each comprised of an adjustment state and an input variable value, are compared with each other.

5. The method according to claim 1, wherein a number of devices under test are positioned successively at the first test device and where for each device under test steps a) through d) are each performed, wherein the values acquired at the first test device are cached, wherein the devices under test are afterwards successively positioned at the further test device, and steps e) through j) are each performed for each device under test.

6. The method according to claim 5, wherein the measured values acquired for a device under test at the first test device are each relayed to the further test device before values are acquired for a further device under test at the first test device, and wherein the values relayed to the further test device are cached in a queue until the steps f) to through h) have been completed for the given device under test.

7. The method according to claim 5, wherein an identifying code is assigned to each of the individual devices under test, wherein the code, together with the measured values acquired for the given device under test at the first test device, is relayed to the further test device in the form of a data set and is cached there, wherein after every positioning of a device under test at the further test device, the code assigned to the given device under test is relayed to the further test device, and wherein in step i) the measured values of this data set are compared with the measured values acquired for the device under test at the further test device, where the code stored in the data set corresponds with the code belonging to the device under test positioned at the further test device.

8. The method according to claim 5, wherein the devices under test each have an electronic circuit that is integrated into a semiconductor chip and that has at least one sensor element, and wherein the circuits are integrated into a wafer and the semiconductor chips are diced from the wafer before the devices under test are positioned at the test device.

9. The method according to claim 5, wherein the semiconductor chips are installed in a package before the devices under test are positioned at the test device.

10. The method according to claim 1, wherein the disturbance variable is a temperature.

11. The method according to claim 1, wherein the input variable is a magnetic flux density.

12. The method according to claim 1, wherein the offset of the output signal and/or a gain factor of at least one amplifier that provides the output signal of the device under test is set by changing the adjustment states.

* * * * *